United States Patent
Frissen et al.

(10) Patent No.: US 10,073,358 B2
(45) Date of Patent: Sep. 11, 2018

(54) LITHOGRAPHIC APPARATUS AND DEVICE MANUFACTURING METHOD

(71) Applicant: ASML Netherlands B.V., Veldhoven (NL)

(72) Inventors: Petrus Carolus Maria Frissen, Veldhoven (NL); Gerardus Lucien Mathildus Jansen, Veldhoven (NL); George Arie Jan De Fockert, Veldhoven (NL)

(73) Assignee: ASML NETHERLANDS B.V., Veldhoven (NL)

(*) Notice: Subject to any disclaimer, the term of this patent is extended or adjusted under 35 U.S.C. 154(b) by 157 days.

(21) Appl. No.: 14/890,129

(22) PCT Filed: May 20, 2014

(86) PCT No.: PCT/EP2014/060280
§ 371 (c)(1),
(2) Date: Nov. 9, 2015

(87) PCT Pub. No.: WO2014/187792
PCT Pub. Date: Nov. 27, 2014

(65) Prior Publication Data
US 2016/0070181 A1   Mar. 10, 2016

Related U.S. Application Data

(60) Provisional application No. 61/826,892, filed on May 23, 2013.

(51) Int. Cl.
*G03B 27/58* (2006.01)
*G03F 7/20* (2006.01)
(Continued)

(52) U.S. Cl.
CPC ....... *G03F 7/70758* (2013.01); *H01F 13/003* (2013.01); *H02K 15/03* (2013.01);
(Continued)

(58) Field of Classification Search
CPC ... G03F 7/70758; H01F 13/003; H02K 15/03; H02K 2201/18; H02K 41/02; H02K 41/031
(Continued)

(56) References Cited

U.S. PATENT DOCUMENTS 3,064,149 A   11/1962   Baermann
5,200,729 A   4/1993   Soeda et al.
(Continued)

FOREIGN PATENT DOCUMENTS

EP   1 179 883   2/2002
JP   S55-100069   7/1980
(Continued)

OTHER PUBLICATIONS

Machine Translation of Mitsuyoshi JP 2002-319507, Oct. 31, 2002.*
(Continued)

*Primary Examiner* — Peter B Kim
(74) *Attorney, Agent, or Firm* — Pillsbury Winthrop Shaw Pittman, LLP

(57) ABSTRACT

A magnetization tool for post-assembly magnetization of a magnet assembly including a main coil, an end surface of the main coil configured to be positioned substantially parallel to an outer surface of the magnet assembly for magnetizing a magnetic pole of the magnet assembly, the main coil being configured to generate a magnetic field and a shielding arrangement positioned adjacent the main coil in a plane substantially parallel to the end surface of the main coil, whereby the shielding arrangement is configured to generate
(Continued)

a shielding magnetic field, whereby a resulting magnetic field of the shielding magnetic field and the magnetic field is substantially only protruding the magnetic pole of the magnet assembly and directly adjacent magnetic poles of the magnet assembly such that the magnetic pole of the magnet assembly and the directly adjacent magnetic poles of the magnetic pole have a substantially opposite polarity.

28 Claims, 9 Drawing Sheets

(51) Int. Cl.
  *H01F 13/00* (2006.01)
  *H02K 41/03* (2006.01)
  *H02K 15/03* (2006.01)
  *H02K 41/02* (2006.01)
(52) U.S. Cl.
  CPC ........... *H02K 41/02* (2013.01); *H02K 41/031* (2013.01); *H02K 2201/18* (2013.01)
(58) Field of Classification Search
  USPC .......................................................... 355/72
  See application file for complete search history.

(56) References Cited

U.S. PATENT DOCUMENTS

| | | |
|---|---|---|
| 6,998,737 B2 | 2/2006 | De Weerdt |
| 2005/0077786 A1 | 4/2005 | De Weerdt |
| 2008/0122565 A1* | 5/2008 | Komura ................ H01F 13/003 335/284 |
| 2008/0169892 A1* | 7/2008 | Komura ................ H01F 13/003 335/284 |

FOREIGN PATENT DOCUMENTS

| | | |
|---|---|---|
| JP | H05-502553 | 4/1993 |
| JP | H06-275434 | 9/1994 |
| JP | 2002-058215 | 2/2002 |
| JP | 2002-260923 | 9/2002 |
| JP | 2002-319507 | 10/2002 |
| JP | 2004-147378 | 5/2004 |
| JP | 2005-117049 | 4/2005 |

OTHER PUBLICATIONS

International Preliminary Report on Patentability dated Dec. 3, 2015 in corresponding International Patent Application No. PCT/EP2014/060280.
International Search Report and Written Opinion dated Nov. 12, 2014 in corresponding International Patent Application No. PCT/EP2014/060280.
Japanese Office Action dated Feb. 6, 2017 in corresponding Japanese Patent Application No. 2016-514364.

* cited by examiner

LITHOGRAPHIC APPARATUS AND DEVICE MANUFACTURING METHOD

CROSS-REFERENCE TO RELATED APPLICATIONS

This application is the U.S. national phase entry of PCT patent application no. PCT/EP2014/060280, which was filed on May 20, 2014, which claims the benefit of priority of U.S. provisional application No. 61/826,892, which was filed on May 23, 2013, and which is incorporated herein in its entirety reference.

FIELD

The present invention relates to a magnetization tool for magnetizing a magnet assembly of an electromagnetic motor, a method of manufacturing a magnet assembly for an electromagnetic motor, an electromagnetic motor, and a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In general, the positioning of both the substrate and the patterning device is provided by positioning devices that include one or more electromagnetic motors or actuators, such as linear or planar motors. Such motors typically comprise a coil assembly comprising one or more coils, arranged to co-operate with a magnet assembly that typically comprises an array of permanent magnets providing an alternating magnetic field distribution. In general, these magnets are mounted to a support structure such as a magnetic support structure (e.g. including a ferromagnetic yoke) after being magnetized. Once magnetized, care should be taken in the handling of such permanent magnets as the magnets may be subject to comparatively large forces when brought near other magnets or magnetic structures such as ferromagnetic support structures.

Further, it should be noted that, once magnetized, the processing of such magnets may be restricted. As an example, an accurate machining of the magnets may be difficult if not impossible as a result of the forces exerted by the magnets. Further, in order to avoid de-magnetization, heat treatments of the magnets may be subject to limitations, such limitation e.g. resulting in an extended manufacturing time.

SUMMARY

It is desirable to facilitate the manufacturing of a magnet assembly of an electromagnetic motor and/or facilitate a further processing of such a magnet assembly.

According to an aspect of the present invention there is provided a magnetization tool for post-assembly magnetization of a magnet assembly comprising an alternating pattern of magnets for a planar or linear electromagnetic motor, the magnetization tool comprising:
  a main coil assembly comprising a main coil, an end surface of the main coil being configured to be positioned substantially parallel to an outer surface of the magnet assembly for magnetizing a magnetic pole of the magnet assembly, whereby an outer volume of the magnet assembly is entirely located outside an outer volume of the main coil, the main coil being configured to generate a magnetic field and
  a shielding arrangement positioned adjacent the main coil in a plane substantially parallel to the end surface of the main coil, whereby the shielding arrangement is configured to generate a shielding magnetic field, whereby a resulting magnetic field of the shielding magnetic field and the magnetic field is substantially only protruding the magnetic pole of the magnet assembly and directly adjacent magnetic poles of the magnet assembly such that the magnetic pole of the magnet assembly and the directly adjacent magnetic poles of the magnetic pole have a substantially opposite polarity.

According to another aspect of the invention, there is provided a magnetization tool for post-assembly magnetization of a magnet assembly for a planar or linear electromagnetic motor, the magnetization tool comprising:
  a main coil assembly comprising a main coil, an end surface of the main coil being arranged to be positioned substantially parallel to an outer surface of the magnet assembly for simultaneously magnetizing a plurality of magnetic poles of the magnet assembly, whereby an outer volume of the magnet assembly is entirely located outside an outer volume of the main coil and the main coil having a meandering pattern of substantially straight portions and curved portions defining the boundaries of the plurality of the magnetic poles.

According to yet another aspect of the invention, there is provided a method of manufacturing a magnet assembly for a linear or planar electromagnetic motor, the method comprising:
  providing a magnet assembly for a linear or planar electromagnetic motor, the magnet assembly comprising one or more permanent magnets to be magnetized;
  applying a magnetization tool according to the invention to obtain a desired magnetic pole distribution for the linear or planar motor by magnetizing each magnetic pole of the desired magnetic pole distribution using the magnetization tool.

According to yet another aspect of the present invention, there is provided an electromagnetic motor comprising a magnet assembly manufactured according to the method of manufacturing according to the invention.

According to yet another aspect of the present invention, there is provided a lithographic apparatus comprising an electromagnetic motor according to the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
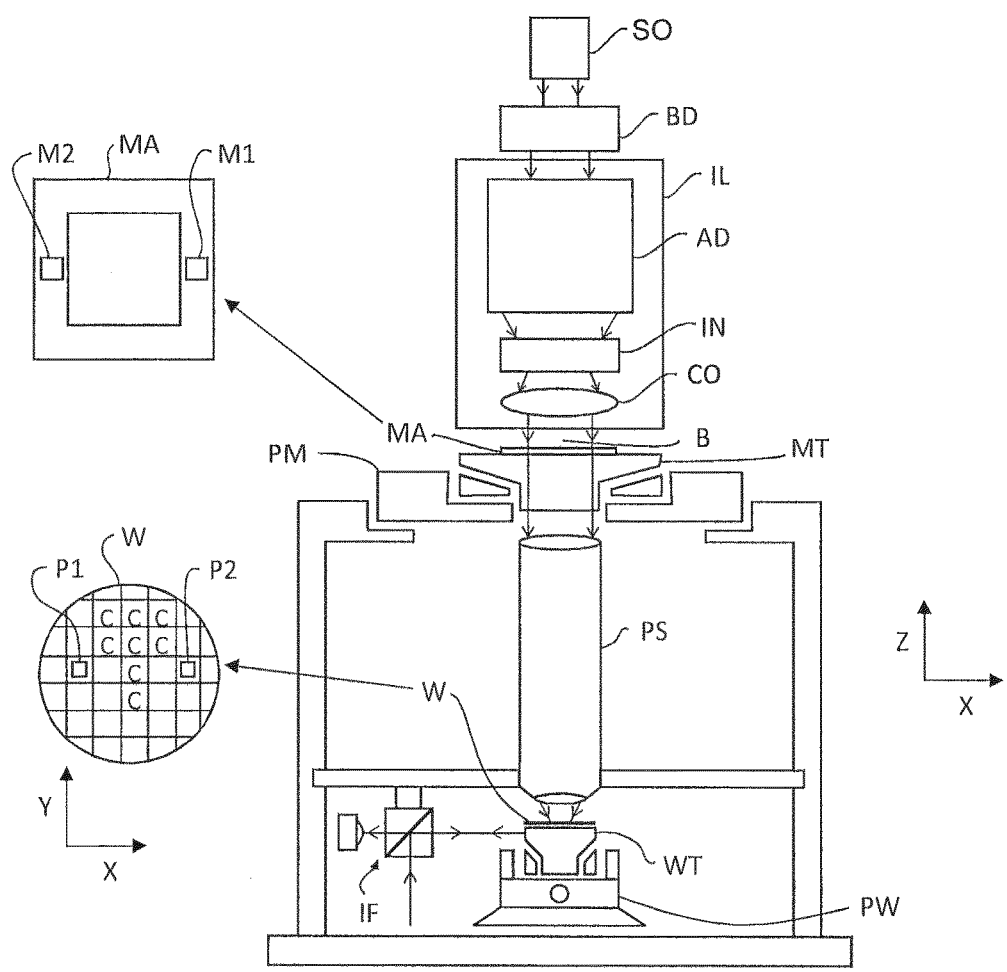
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a support structure or patterning device support (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the support structure (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the support structure (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies. In accordance with an embodiment of the present invention, the first or second positioning device (or both) may comprise an electromagnetic motor according to an embodiment of the present invention, including a magnet assembly that is manufactured according to a manufacturing method according to an embodiment of the invention. Such an electromagnetic motor may e.g. be applied in the aforementioned long-stroke module, the motor e.g. including one or more linear motors (e.g. configured as a so-called H-drive) or a planar motor. In an embodiment, the lithographic apparatus may also comprise an electromagnetic motor according to an embodiment of the invention for positioning an element such as an optical element of the illuminator IL or the projection system PS.

The depicted apparatus could be used in at least one of the following modes:

1. In step mode, the support structure (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the support structure (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the support structure (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In an embodiment, there is provided a manufacturing method of a magnet assembly of an electromagnetic motor.

Figure 2:
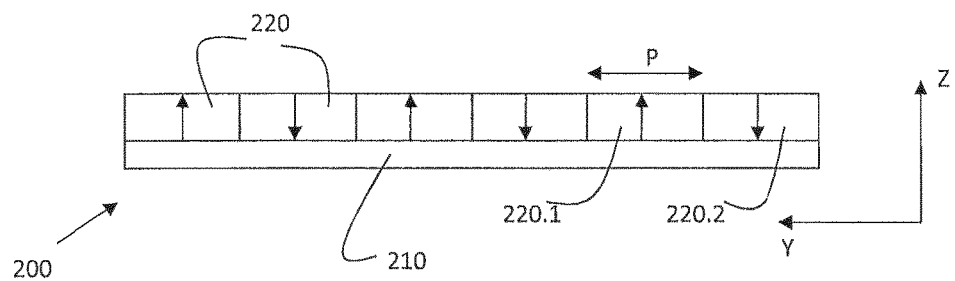
FIG. 2 schematically depicts a cross-section of a magnet assembly as can be applied in a linear motor.

In FIG. 2, a cross-sectional view of a magnet assembly 200 is schematically shown. The magnet assembly as shown comprises a supports structure 210, which can e.g. be a ferromagnetic support structure, and an array of permanent magnets 220 that are alternatingly magnetized, i.e. the magnetization direction along the array of magnets alternates. With respect to the support structure, alternative alloys such as CoFe may be considered as well. As a further alternative, as explained in more detail below, the magnet assembly may comprise, as an alternative to comprising a plurality of discrete separate magnets, a sheet or plate of magnetisable material, such as bonded Neodium or other rare-earth mixtures or alloys. In the array, different pole pairs can be identified, such as the pole pair comprising magnets 220.1 and 220.2, each forming a magnetic pole (e.g. referred to as a North or South pole) having a magnetic pole pitch P.

The magnet pattern as schematically shown in FIG. 2 may be expanded in the direction perpendicular to the YZ-plane, thus forming a two-dimensional alternating array of magnets, arranged in a so-called checkerboard pattern.

Note that, as an alternative to applying a mere pattern of alternatingly positioned North and South poles (i.e. magnets that are magnetized in either the positive Z-direction or the negative Z-direction), a more advanced pattern may include so-called Halbach magnets arranged in between the (main) magnets, the Halbach magnets being at least partly magnetized along the Y-direction (see also further on).

Figure 3:
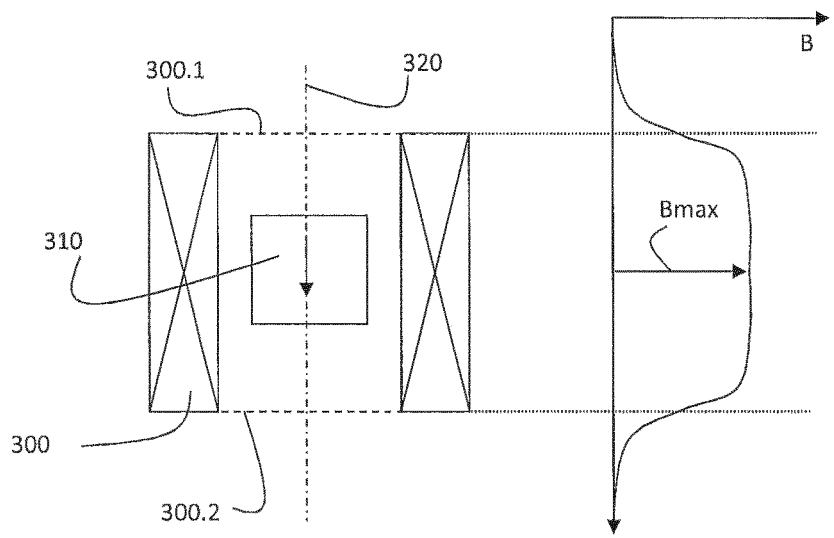
FIG. 3 schematically depicts a conventional manner of magnetizing a permanent magnet.

In general, the individual magnets of a magnet assembly as described with reference to FIG. 2 are assembled (e.g. mounted to the appropriate position on the support structure 210) when already magnetized. In order to magnetize a permanent magnet, the magnet is subjected to a comparatively high magnetic field, typically in the order of 2 T. In FIG. 3, a known arrangement for a magnetization of a permanent magnet is schematically shown. The arrangement comprises a coil 300 that is arranged to receive a magnet 310 to be magnetized. Typically, the magnet to be magnetized is fully enclosed by the magnetizing coil 300. This is due to the variation of the magnetic field strength B inside the coil. On the right of the coil 300, FIG. 3 schematically shows the magnetic field strength B [T] along a central axis 320 of the coil. As can be seen from the graph, in the central region of the coil 300 (i.e. the region where the magnet 310 is located during the magnetization), a maximum magnetic field strength Bmax can be observed. Near the borders of the coil (i.e. at the end surfaces 300.1 and 300.2 of the coil 300), the magnetic field strength is only half the value of Bmax.

As such, a magnetization of a permanent magnet whereby the magnet is provided in a central region of an encompassing coil, is know to provide the most efficient magnetization, with respect to required power to generate the required magnetic field to magnetize the permanent magnet.

However, it has been observed by the inventors that a subsequent handling and processing the already magnetized permanent magnets may pose various obstacles.

First of all, once magnetized, considerable forces may be experienced during the handling of such magnetized magnets, due to the interaction of the magnets with either other magnets or ferromagnetic structures such as support structure or the like. When an automated handling of such magnets is envisaged, the design of such a handling tool needs to consider these forces, thus adding to the costs of such a tool. Further, other types of activities such as transport and storage of the magnetized magnets may also need to take the forces as generated by the magnets into account. It should also be noted that the manual handling of such magnets may pose an important safety risk for the operators.

Further, once a magnet assembly has been assembled, it may be desired or needed to perform additional processing steps on the magnets or e.g. the top surface of the magnets.

As a first example, it may e.g. be beneficial to ensure that the top surface of the permanent magnet is machined, e.g. polished to have a surface roughness or flatness below a specific value. By doing so, the top surface could e.g. be applied as a bearing surface, e.g. an air bearing surface.

In particular, in the case of a planar electromagnetic motor, this may present several benefits. As mentioned, the assembly of a planar motor magnet assembly is typically performed by gluing pre-magnetized magnets on a ferromagnetic support structure, also referred to as a back plate. Subsequently, a top cover plate is glued on the top surface of the permanent magnets, typically leading to a final flatness of 0.2 mm. However, when a machining of the top surface is enabled (due to the fact that the magnets are not magnetized yet, one may e.g. grind or polish the top surface of the 'non-magnetized' magnets to a flatness in the range of some µm's. This may enable the magnet assembly to be used as an air bearing (typically requiring a flatness of 5 µm). Further benefits worth mentioning are that the power consumption of the electromagnetic motor may be less due to smaller magnetic air gaps (typically—20%) and a reduction in so-called drive torque can be obtained.

As a second example, depending on the application of the electromagnetic motor comprising the magnet assembly, heat treatments of the magnet assembly may be required, e.g. for outgas sing purposes. However, as a result of the magnetization and as a consequence the risk of possible de-magnetization, the heating of the permanent magnets is limited, e.g. to 40° C., thus resulting in a longer heat treatment or an ineffective heat treatment, posing additional problems in the application of the motor, e.g. in vacuum applications.

Figure 4:
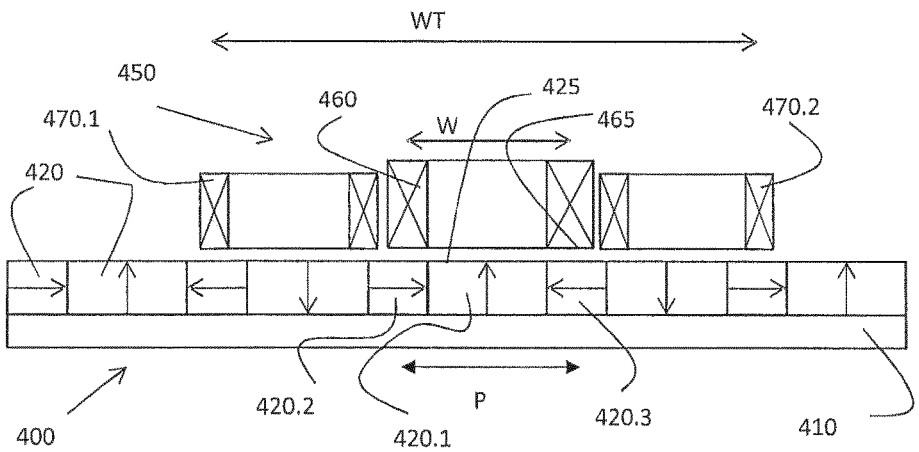
FIG. 4 schematically depicts a cross-section of a magnetization tool according to an embodiment of the present invention.

In order to at least mitigate some of the problems mentioned, the present invention provides, in an embodiment, in a magnetization tool for post-assembly magnetization of a magnet assembly for a planar or linear motor, such a magnet assembly e.g. comprising an alternating pattern of magnets, e.g. one- or two-dimensional. In FIG. 4, a cross-section of a first embodiment of a magnetization tool according to the present invention is schematically shown.

FIG. 4 schematically shows a cross-section of a magnet assembly 400 comprising a plurality of magnets 420, arranged in a Halbach configuration, having a magnetic pole pitch P. The plurality of magnets being mounted on a support structure 410. In FIG. 4, a first embodiment of a magnetization tool 450 according is shown, the magnetization tool 450 comprising: a main coil assembly comprising a main coil 460, whereby, an end surface 465 of the main coil 460 is configured to be positioned substantially parallel to an outer surface 425 of the magnet assembly 400. In the indicated position, the main coil 460 can be supplied with sufficiently high current for magnetizing a magnetic pole of the magnet assembly, without having to bring the magnet (or magnets) to be magnetized inside a central volume of the coil. In the position as shown, the magnetization tool is arranged to magnetize the magnetic pole comprising the main magnet 420.1 and the adjacent Halbach magnets 420.2 and 420.3 of the magnetic pole. In accordance with an embodiment of the present invention, an outer volume of the magnet assembly is entirely located outside an outer volume of the main coil.

Within the meaning of the present invention, an outer volume of an object is a volume defined by the outer dimensions of the object. The magnet assembly is thus kept entirely outside the magnetizing coil (i.e. the main coil 460) during the magnetization process of the magnetic pole. In accordance with an embodiment of the present invention, the magnetization tool further comprises a shielding arrangement positioned adjacent the main coil in a plane substantially parallel to the end surface, whereby the shielding arrangement is configured to generate a shielding magnetic field. In the embodiment as shown, the shielding arrangement is an active shielding arrangement which comprises two auxiliary coils 470.1 and 470.2 for generating a shielding magnetic field. In accordance with an embodiment of the present invention, the shielding arrangement is configured such that a resulting magnetic field of the shielding magnetic field and a magnetic field generated by the main coil is substantially only protruding the magnetic pole that is to be magnetized and directly adjacent magnetic poles having an opposite polarity. In the embodiment as shown, the auxiliary coils 470.1 and 470.2 provide (by the generation of the shielding magnetic field) a containment of the resulting magnetic field to the magnetic pole facing the main coil and the magnetic poles that are directly adjacent, and which have an opposite polarity.

When such a shielding arrangement would be omitted, the magnetic field as generated by the main coil could result in a (partial) de-magnetization of some of the magnets of the array, due to these magnets having a polarization that is substantially opposite to the direction of the protruding magnetic field.

As can be seen in FIG. 4, the main coil 460 substantially has a width W corresponding to the magnetic pole pitch P. In order to substantially avoid the risks of de-magnetization, the overall width WT of the main coil 460 and the auxiliary coils 470.1 and 470.2, should be smaller or equal to three times the magnetic pole pitch P. In order to provide the shielding magnet field, a current of ½I can be provided to the auxiliary coils, I being the current that is supplied to the main coil.

The magnetization tool as schematically shown in FIG. 4, may be applied to magnetize linear arrays of permanent magnets, either having a magnet array 200 as shown in FIG. 2 or a so-called Halbach array as shown in FIG. 4. In order to magnetize the entire array, the different magnetic poles of the array are magnetized in a step-by-step process, whereby the main coil is positioned facing each of the magnetic poles and is provided with an appropriate current (or current pulse) in order to magnetize the magnetic pole, one after the other.

Note that at present, magnet assemblies for linear or planar motors make use of anisotropic permanent magnets, i.e. magnets having a preferred magnetization direction. Such magnets provide a higher magnetic field strength compared to isotropic permanent magnets. Magnetizing such magnets using a magnetization tool according to the invention is determined by the magnetization direction of the anisotropic magnets applied. The shape and positioning of the main coil and shielding arrangement of the magnetizing tool should correspond to the required magnetic field distribution determined by the dimensions and orientation of the applied permanent magnets. The magnetization tool according to an embodiment of the invention may also be applied for the magnetization of isotropic permanent magnets. Such magnets can be magnetized in a similar manner as described with respect to the anisotropic magnets. However, because of the isotropic nature of the magnetic material applied, the size of the magnets need not correspond to the desired alternating magnet pattern; the pattern, e.g. described by the magnetic pole pitch P will be defined by the size of the main coil, i.e. the width of the main coil. Note that in such an arrangement, the magnet assembly does not need to comprise separate magnets but may e.g. comprise a single sheet or plate or strip of isotropic permanent magnet material (such as e.g. PNeo, bonded Neodymium) which can be provided with a desired alternating magnet pattern by magnetizing the material using a magnetization tool according to the invention. Alternatively, in case of producing an anisotropic magnetic material, during powder pressing of the anisotropic magnet material an external H-field is applied around the pressing tool to pre-align the magnetic particles in the magnetic material. Applying such an external H-field results in that after sintering, the magnetic particles are aligned in a preferred magnetization direction in a range between 0 and 90 degrees. This is beneficial as such an orientation of the magnetic particles, enables a sinusoidal magnetization of the magnetic particles during powder pressing. As the magnetic particles are magnetized in a sinusoidal optimized Halbach configuration in accordance with an embodiment of the invention, the magnetic field strength may increase about 20% in comparison with a Halbach array configuration as shown in FIG. 4.

The magnetization tool as shown in FIG. 4, i.e. a magnetization tool having an active shielding arrangement, may also be applied to magnetize a two-dimensional array of permanent magnets, e.g. to generate a magnet assembly of a planar motor.

In FIG. 5, a top view of a magnet assembly of such a motor is schematically shown, together with a magnetization tool for magnetizing such an assembly.

Figure 5A:
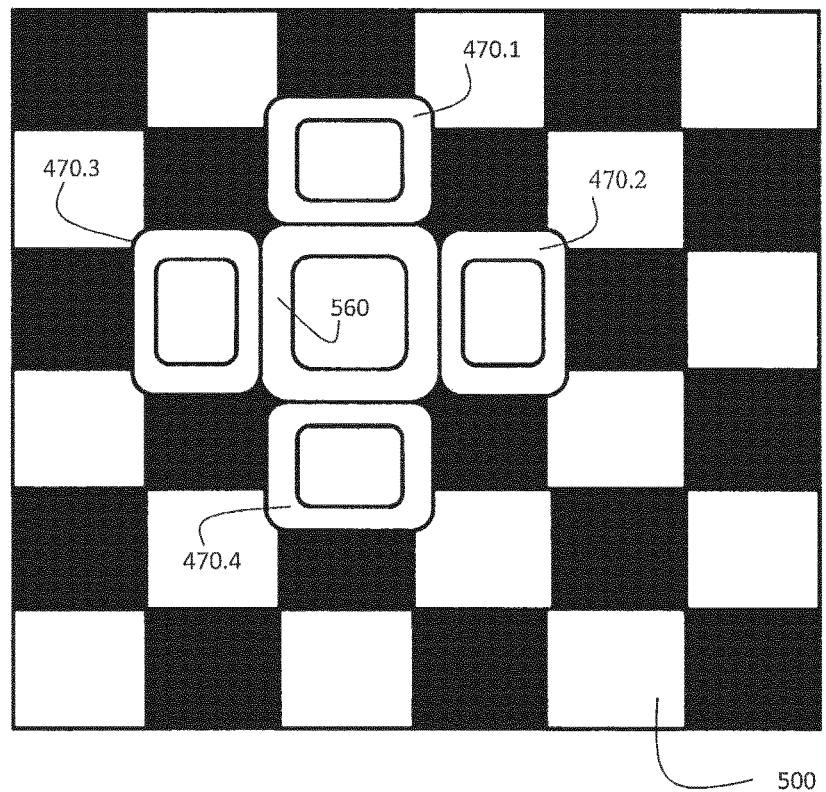
FIG. 5a schematically depicts a top view of a magnetization tool according to an embodiment of the present invention.

In FIG. 5a, 500 denotes a two-dimensional pattern of permanent magnets, arranged in a checkerboard pattern, the permanent magnets being assembled (e.g. mounted to a common support structure) prior to being magnetized. FIG. 5a further schematically shows a second embodiment of a magnetization tool, the magnetization tool comprising a main coil 560 and four auxiliary coils 470.1-470.4 for generating a shielding magnetic field such that the resulting magnetic field of the shielding magnetic field and a magnetic field generated by the main coil is substantially only protruding the magnetic pole facing the main coil and directly adjacent magnetic poles having an opposite polarity.

Figure 5B:
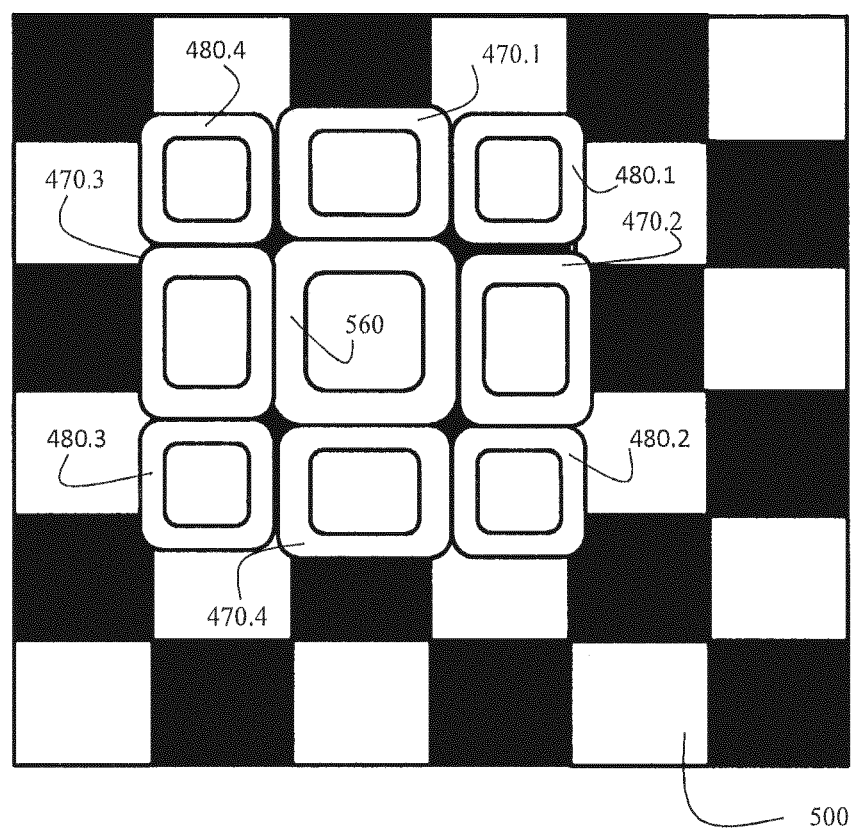
FIG. 5b schematically depicts a top view of a magnetization tool according to an embodiment of the present invention.

In a further embodiment, shown in FIG. 5b, 4 additional auxiliary coils are provided (480.1-480.4) that face magnetic poles having the same polarity as the magnetic pole facing the main coil, these coils being adjacent the magnetic pole facing the main coil 560, along a diagonal of the two-dimensional magnet pattern 500. Energizing these coils may provide a further improvement with respect to the magnetization of the magnetic pole facing the main coil and may further facilitate in avoiding a (partial) de-magnetization.

Instead of applying an active shielding arrangement, as e.g. described in FIGS. 4, 5a and 5b, the magnetization tool according to an embodiment of the present invention may also be equipped with a passive shielding arrangement, such shielding making use of inducing Eddy currents in a solid electrical conductor that is appropriately positioned adjacent a main coil of the magnetization tool.

Figure 6A:
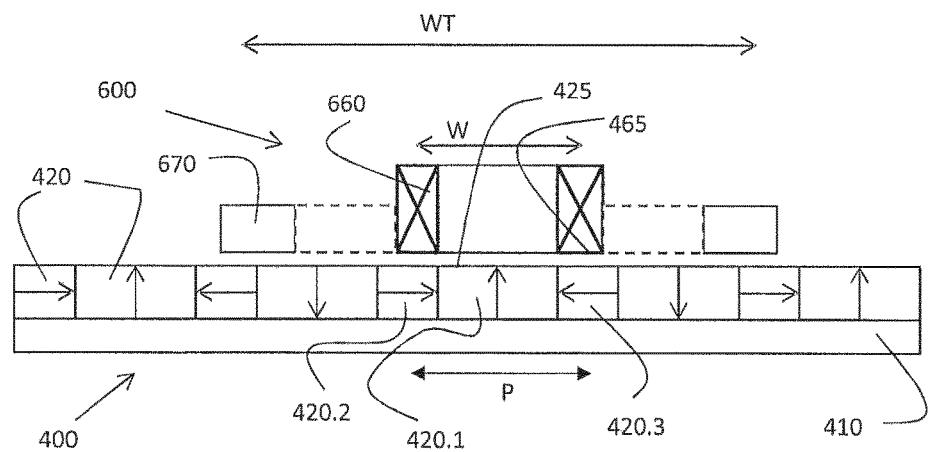
FIGS. 6a and 6b schematically depicts a cross-section and top view of a magnetization tool according to an embodiment of the present invention.
Figure 6B:
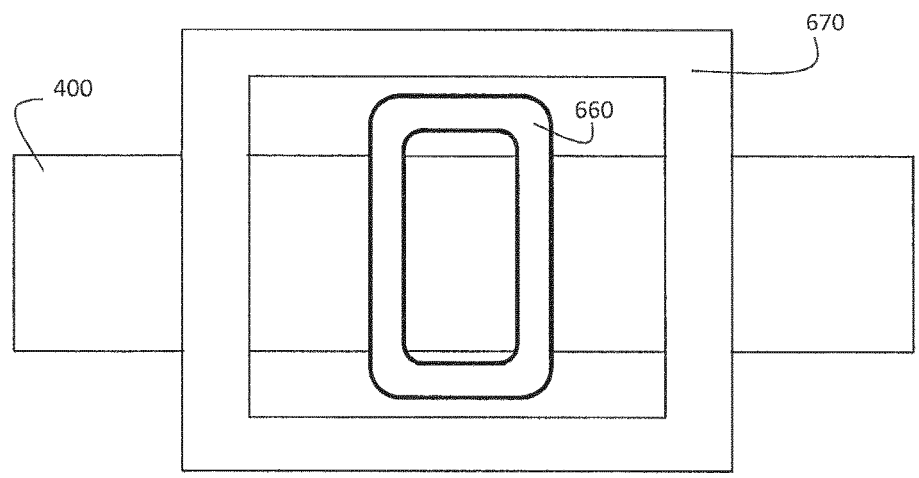

FIGS. 6a and 6b schematically show a cross-sectional view and a top view of such a magnetization tool, combined with a magnet assembly for a linear motor, i.e. an array of alternatingly polarized permanent magnets. In FIG. 6a, the same array 400 of FIG. 4 is schematically shown, together with a main coil 660 of a third embodiment of a magnetization tool 600. As in FIG. 4, the main coil 660 faces a magnetic pole comprising the permanent magnets 420.1-420.3 to be magnetized. The magnetization tool 600 further comprises an electrical conductor 670 positioned adjacent the main coil 660 for generating a shielding magnetic field by means of Eddy currents induced in the conductor. As such, the electrical conductor may e.g. be a solid frame-shaped conductor, or a short-circuited coil that surrounds the main coil. In the embodiment as shown, the shielding arrangement comprises a frame-shaped conductor (see also FIG. 6b) having a width essentially spanning three times the magnetic pole pitch P. When a current pulse is applied to the main coil 660, Eddy currents will be induced in the solid frame-shaped conductor 670, thus generating a shielding magnetic field. As a result, the resulting magnetic field of the shielding magnetic field and the magnetic field generated by the main coil is substantially only protruding the magnetic pole facing the main coil (i.e. the magnetic pole including magnets 420.1-420.3) and directly adjacent magnetic poles having an opposite polarity. As a result, the resulting magnetic field can be essentially limited to affect the magnetic pole along the width WT determined by the dimensions of the shielding arrangement, i.e. the solid frame-shaped conductor. FIG. 6b schematically shows a top-view of the embodiment of FIG. 6a, schematically showing the magnet assembly 400, the main coil 660 and the shielding arrangement comprising a solid frame-shaped conductor 670.

As an example, the frame-shaped conductor can be made from Copper or Aluminum, or an alloy thereof.

Figure 7:
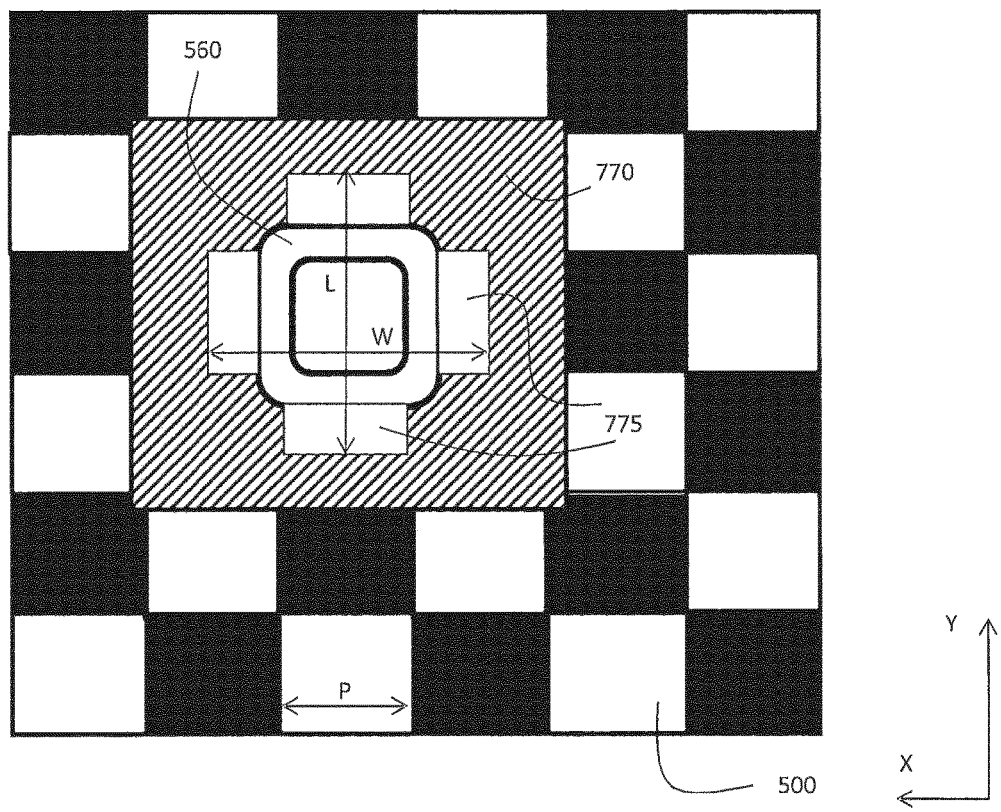
FIG. 7 schematically depicts a top view of a magnetization tool according to an embodiment of the present invention.

The application of a passive shielding arrangement, 'passive' meaning that the shielding arrangement is not provided with coils that need to be energized, may also be expanded in 2D. A top-view of such an arrangement is schematically shown in FIG. 7. FIG. 7 shows, similar to the FIGS. 5a and 5b, a two-dimensional magnet pattern 500, e.g. for a planar motor. FIG. 7 further shows a fourth embodiment of a magnetization tool. The magnetization tool as shown comprises a main coil 560 (see also FIGS. 5a and 5b) and shielding arrangement comprising a solid electrical conductor, shaped as a square plate 770 having a cross-shaped aperture 775 therein. The cross-shaped cavity 775 has a length L and width W (L=W) in the main directions (X- and Y-direction) of the alternating magnet pattern 500. The magnetization tool as schematically shown in FIG. 7 operates in essentially the same manner as the tool shown in FIGS. 6a and 6b. When a current pulse is provided to the main coil 560, Eddy currents are induced in the plate 770, essentially along the boundaries of the cross-shaped aperture 775, thus generating a shielding magnetic field which, combined with the magnetic field of the main coil 560, results in a resulting magnetic field that is substantially only protruding the magnetic pole facing the main coil 560 and directly adjacent magnetic poles having an opposite polarity. In order to realize this, the dimensions of cross-shaped cavity 775 should be appropriately selected. To mitigate the risk of de-magnetization, the width W and length L of the aperture 775 should be selected, in an embodiment, to be smaller or equal to three times the magnetic pole pitch P.

The above described embodiments in FIGS. 4 to 7 enable a local post-assembly magnetization of a magnet assembly for a linear or planar motor, by e.g. stepwise magnetizing all required magnetic pole of the magnet assembly.

In order to energize the main coil of the magnetization tool and, when present, the auxiliary coils of the shielding arrangement, a power supply can be provided.

As discussed above, in order to appropriately magnetize the permanent magnets, the permanent magnets should be subjected to a magnetic field strength of approximately 2 T. In order to generate such a magnetic field using an arrangement as e.g. shown in FIGS. 4 to 7, a considerable current density may be required in the main coil of the magnetization tool. Typical values may be up to 5000 A/mm2.

Figure 8A:
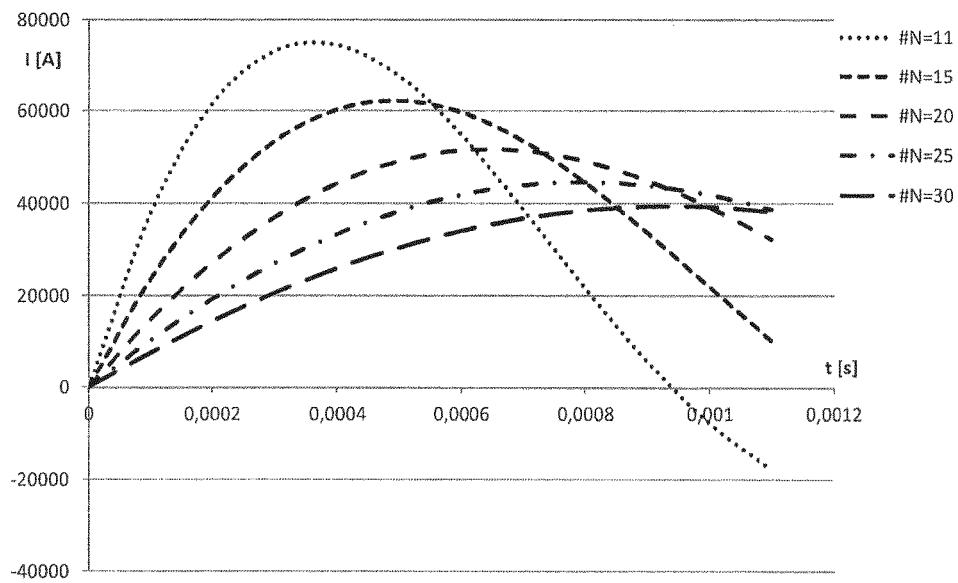
FIGS. 8a and 8b schematically depicts a current and magnetic field profile for different types of main coils of a magnetization tool according to an embodiment of the invention.

In order to generate such current densities, a charged capacitance or a current carrying coil may e.g. be applied as a power supply. As an example, a capacitance of 8000-10000 microfarad which is charged to e.g. 3000 V can be used to power the main coil. The main coil as applied in the magnetization tools as discussed above may comprise multiple turns, e.g. 10-15 turns. The number of turns applied determines the inductance value of the main coil and, combined with the capacitance value (when a capacitor is applied as a power supply), the shape of current pulse, in particular the maximum value of the supplied current which can be generated. Depending on the required size of the coil (the size of the coil being linked to the required magnetic pole pitch), an optimal number of turns can be determined, e.g. through experimentation or simulation. In FIG. 8a, the current I through a main coil of the magnetization tool is shown as a function of time t, for different values of the number of turns N of the coil, the number of turns ranging from 11 to 30.

Figure 8B:
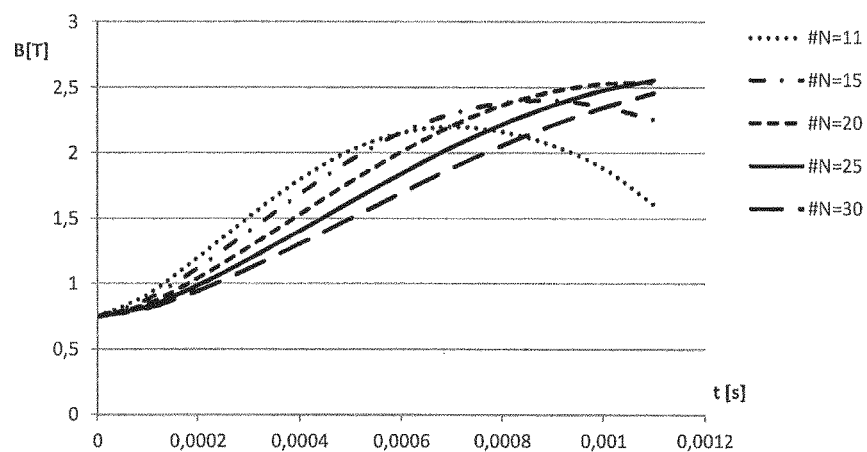

In FIG. 8b, the corresponding magnetic field strength B at 2 mm from the bottom of the permanent magnet is schematically shown. From a comparison between the current profiles and the magnetic field profiles, one can observe that there appears to be a delay of the magnetic field relative to the current. This delay may e.g. be caused by the induction of the coil and due to Eddy currents that are being generated in the support structure to which the magnets are mounted, such as the support structure 410 discussed above.

Figure 9A:
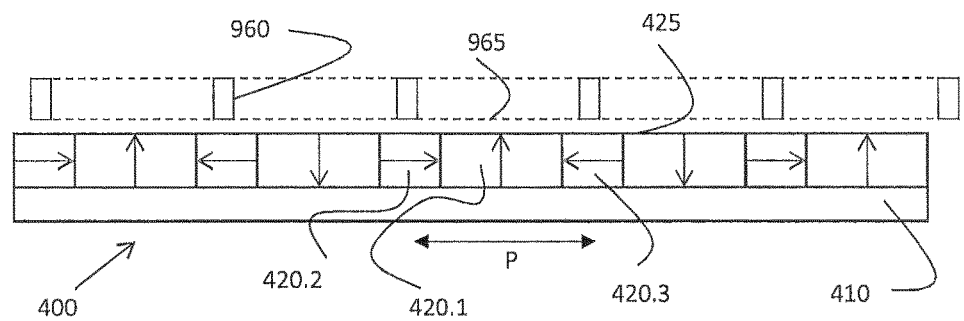
FIGS. 9a and 9b schematically depicts a cross-section and top view of a magnetization tool according to an embodiment of the present invention.
Figure 9B:
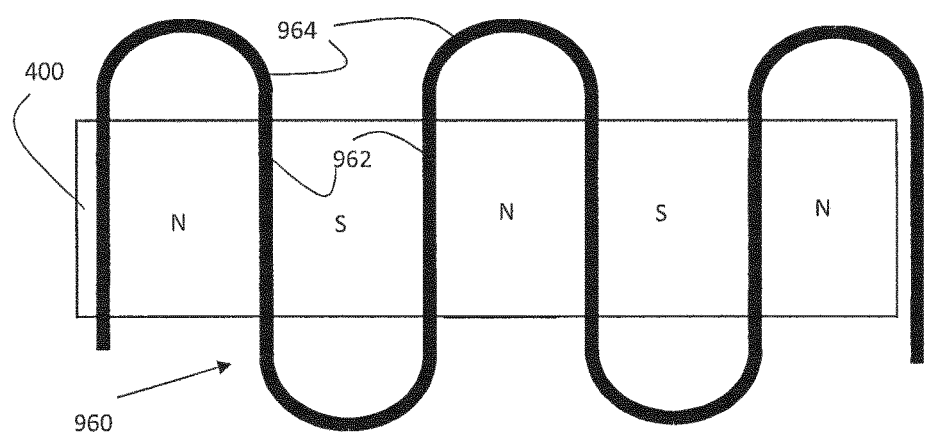

Whereas the magnetization tools as discussed above provide in a localized magnetization of part of a magnet assembly, the following figures provide in alternative embodiments of the magnetization tool according to the present invention, enabling a magnetization of a magnet assembly for a linear or planar motor without having to magnetize each magnetic pole separately. In FIGS. 9a and 9b, a first embodiment of such a magnetization tool according to the present invention is schematically shown.

In FIG. 9a, a cross-section of a magnet assembly 400 is schematically shown together with a magnetization tool according to the present invention, the magnetization tool comprising a main coil 960, and end surface 965 of the main coil 960 facing an outer surface 425 of the magnet assembly 400. In the arrangement, the end surface 965 of the main coil 960 is arranged to be positioned substantially parallel to the outer surface 425 of the magnet assembly 400 for simultaneously magnetizing a plurality of magnetic poles (such as the magnetic pole comprising the magnets 420.1-420.3) of the magnet assembly, whereby an outer volume of the magnet assembly 400 is entirely located outside an outer volume of the main coil 960. As can be seen more clearly in FIG. 9b, the main coil 960 has a meandering pattern of substantially straight portions 962 and curved portions 964 defining the boundaries of the magnetic poles of the magnet assemblies according to the pattern indicated by N and S (North and South).

Using a similar meandering type of main coil, a two-dimensional pattern may be generated as well.

Figure 10:
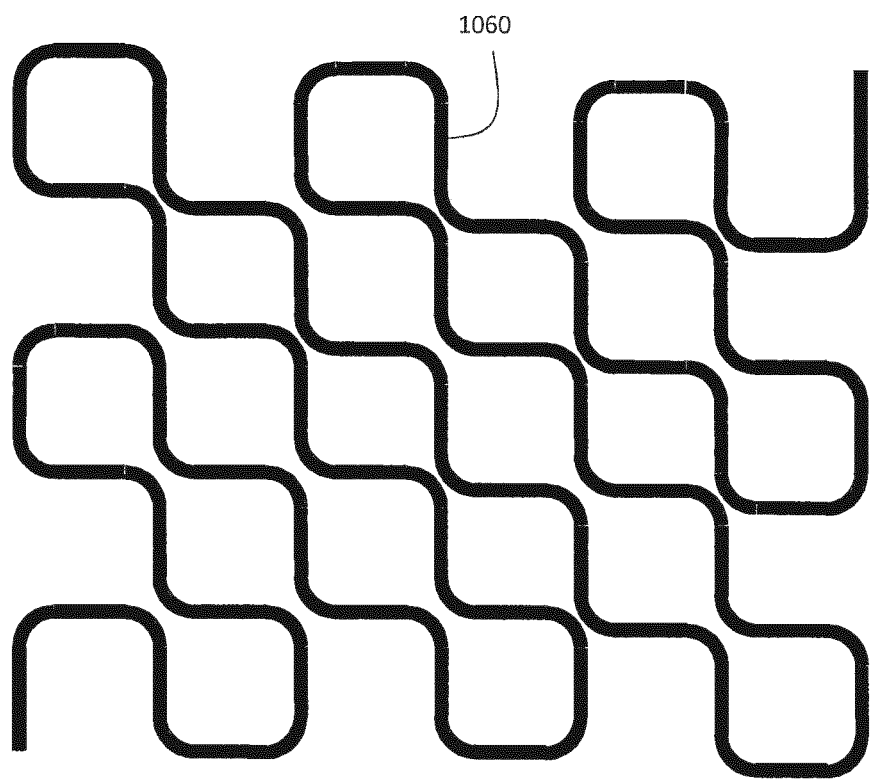
FIG. 10 schematically depicts a top view of a main coil of a seventh embodiment of a magnetization tool according to an embodiment of the present invention.

FIG. 10 schematically shows such a meandering main coil for generating a two-dimensional pattern of alternatingly polarized magnetic poles. Using such a meandering main coil 1060, a magnet assembly 500 as e.g. shown in FIG. 7 can be magnetized in one step. Note that, due to the curves in the meandering coil, the resulting magnetic field distribution may not be entirely symmetrically. In order to solve this, the magnetization may be performed in two consecutive steps, whereby the magnet assembly or plate to be magnetized is rotated about 90 degrees in between the magnetizations.

The embodiments of the magnetization tool as shown in FIGS. 9a to 10 provide the benefit of providing a magnetization of an entire magnet assembly, without the requirement of providing a shielding arrangement. Since the coil assembly used for the magnetization substantially covers the entire magnet assembly, there is no need to take measures against e.g. de-magnetization.

In an embodiment, the magnetization tool, as e.g. described in any of the FIGS. 3 to 10, consists of non-magnetic materials, i.e. the tool does not include any ferromagnetic materials. By doing so, the handing of the tool, in particular the removal of the tool after the magnetization is facilitated.

As already discussed above, once magnetized, handling and processing of permanent magnets may be cumbersome and subject to restrictions. When a magnetization of the magnet assembly of a linear or planar can be realized post assembly, this presents an opportunity to further enhance the manufacturing process of the motor. As such, in an embodiment, there is provided a method of manufacturing a magnet assembly for a linear or planar electromagnetic motor, the method comprising:

providing a magnet assembly for a linear or planar electromagnetic motor, the magnet assembly comprising one or more permanent magnets to be magnetized;

applying a magnetization tool according to any preceding claim to obtain a desired magnetic pole distribution for the linear or planar motor by magnetizing each magnetic pole of the desired magnetic pole distribution using the magnetization tool.

In an embodiment, a top surface of the magnet assembly comprising the plurality of non-magnetized permanent magnets is machined (e.g. polished) prior to the application of the magnetization tool and/or a heat-treatment is applied to the magnet assembly prior to the machining.

The machining of the top surface of the magnet assembly may e.g. enable the top surface to be applied as a bearing surface, e.g. resulting in a more compact and less expensive motor, compared to a motor requiring separate bearing surfaces, e.g. air bearing surface.

Similarly, the possibility of applying a heat treatment at a comparatively high temperature (e.g. >100° C.) may result in a magnet assembly that is likely to cause less contamination when e.g. applied in a vacuum environment. As such, UH vacuum cleaning of the magnet assembly can be done at a comparatively high temperature.

Further, the assembly of the un-magnetized magnets onto a support structure can be done using less expensive tooling, since the tooling need not withstand the important forces generated by the magnets.

It should also be noted that the magnetization tool according to an embodiment of the present invention may beneficially be applied to refurbish existing magnet assemblies. As will be understood by the skilled person, due to the malfunction of a linear or planar motor (whereby e.g. excessive currents are involved), the magnet assembly may (partly) be de-magnetized. Using the magnetization tool according to the invention, the magnetic field distribution can be restored or corrected.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A magnetization tool for post-assembly magnetization of a magnet assembly, the magnet assembly comprising an alternating pattern of magnets for a planar or linear electromagnetic motor, and the magnetization tool comprising:

a main coil assembly comprising a main coil, an end surface of the main coil configured to be positioned substantially parallel to an outer surface of the magnet assembly to magnetize a magnetic pole of the magnet assembly, wherein an outer volume of the magnet assembly is entirely located outside an outer volume of the main coil, the main coil configured to generate a magnetic field; and a shielding arrangement positioned adjacent the main coil in a plane substantially parallel to the end surface of the main coil, the shielding arrangement configured to generate a shielding magnetic field, wherein a resulting magnetic field of the shielding magnetic field and the magnetic field is substantially only protruding the magnetic pole of the magnet assembly and directly adjacent magnetic poles of the magnet assembly such that the magnetic field portion of the resulting magnetic field at least partly magnetizes the magnetic pole of the magnet assembly to have a certain polarity and the shielding magnetic field portion of the resulting magnetic field at least partly magnetizes the directly adjacent magnetic poles of the magnetic pole to have a substantially opposite polarity to the magnetic pole having the certain polarity.

2. The magnetization tool according to claim 1, wherein an inner cross-section of the main coil, parallel to the end surface of the main coil, substantially corresponds to a cross-section of a main magnet of the magnet assembly, parallel to the outer surface of the magnet assembly.

3. The magnetization tool according to claim 1, wherein the shielding arrangement comprises one or more auxiliary coils configured to generate the shielding magnetic field.

4. The magnetization tool according to claim 1, wherein the shielding arrangement comprises an electrical conductor, the shielding magnetic field being induced in the electrical conductor by the magnetic field of the main coil.

5. The magnetization tool according to claim 4, wherein the electrical conductor comprises a copper or aluminum plate.

6. The magnetization tool according to claim 1, further comprising a power supply for the main coil, the power supply comprising a chargeable capacitor.

7. The magnetization tool according to claim 1, wherein the magnetization tool is a non-magnetic magnetization tool.

8. A magnetization tool for post-assembly magnetization of a magnet assembly for a planar or linear electromagnetic motor, the magnetization tool comprising:
   a main coil assembly comprising a main coil, an end surface of the main coil arranged to be positioned substantially parallel to an outer surface of the magnet assembly for simultaneously at least partly magnetizing a two-dimensional array of magnetic poles of the magnet assembly, wherein an outer volume of the magnet assembly is entirely located outside an outer volume of the main coil and the main coil has a meandering pattern with portions defining the boundaries of the plurality of the magnetic poles and the meander extends along a first direction within the array and the meander extends along a second direction, orthogonal to the first section, within the array.

9. The magnetization tool according to claim 8, wherein the meandering pattern of defines at least a one-dimensional array of alternating magnetic poles.

10. The magnetization tool according to claim 8, wherein the meandering pattern defines a two-dimensional array of alternating magnetic poles.

11. The magnetization tool according to claim 8, wherein the meandering pattern substantially defines all required magnetic poles of the magnet assembly.

12. A method of manufacturing a magnet assembly for a linear or planar electromagnetic motor, the method comprising:
   providing a magnet assembly for a linear or planar electromagnetic motor, the magnet assembly comprising one or more permanent magnets to be magnetized; and
   applying a magnetization tool to obtain a desired magnetic pole distribution for the linear or planar electromagnetic motor by magnetizing each magnetic pole of the desired magnetic pole distribution using the magnetization tool, wherein the magnetization tool comprises:
   (1) a main coil assembly comprising a main coil, an end surface of the main coil configured to be positioned substantially parallel to an outer surface of the magnet assembly to magnetize the magnetic poles of the magnet assembly, wherein an outer volume of the magnet assembly is entirely located outside an outer volume of the main coil, the main coil configured to generate a magnetic field, and
   a shielding arrangement positioned adjacent the main coil in a plane substantially parallel to the end surface of the main coil, the shielding arrangement configured to generate a shielding magnetic field,
   wherein a resulting magnetic field of the shielding magnetic field and the magnetic field is substantially only protruding the magnetic pole of the magnet assembly and directly adjacent magnetic poles of the magnet assembly such that the magnetic field portion of the resulting magnetic field at least partly magnetizes the magnetic pole of the magnet assembly to have a certain polarity and the shielding magnetic field portion of the resulting magnetic field at least partly magnetizes the directly adjacent magnetic poles of the magnetic pole to have a substantially opposite polarity to the magnetic pole having the certain polarity; or
   (2) a main coil assembly comprising a main coil, an end surface of the main coil arranged to be positioned substantially parallel to an outer surface of the magnet assembly for simultaneously at least partly magnetizing a two-dimensional array of magnetic poles of the magnet assembly, wherein an outer volume of the magnet assembly is entirely located outside an outer volume of the main coil and the main coil has a meandering pattern with portions defining the boundaries of the plurality of the magnetic poles and the meander extends along a first direction within the array and the meander extends along a second direction, orthogonal to the first section, within the array.

13. The method according to claim 12, wherein providing the magnet assembly comprises mounting a plurality of non-magnetized permanent magnets to a support structure in a pattern corresponding to a pattern of the desired magnetic pole distribution.

14. The method according to claim 13, wherein the support structure comprises a magnetic support structure.

15. The method according to claim 12, wherein a top surface of the magnet assembly comprising the plurality of non-magnetized permanent magnets is machined prior to the application of the magnetization tool.

16. The method according to claim 15, wherein a heat-treatment is applied to the magnet assembly prior to the machining.

17. An electromagnetic motor comprising a magnet assembly manufactured according to the method of claim 12.

18. A lithographic apparatus comprising an electromagnetic motor according to claim 17 to position a component of the lithographic apparatus.

19. The lithographic apparatus according to claim 18, wherein the component comprises:
   a support constructed to support a patterning device, or
   a substrate table constructed to hold a substrate, or
   an element of an illumination system or a projection system.

20. A lithographic apparatus comprising:
   an illumination system configured to condition a radiation beam;
   a support constructed to support a patterning device, the patterning device being capable of imparting the radiation beam with a pattern in its cross-section to form a patterned beam of radiation;
   a substrate table constructed to hold a substrate; and a projection system configured to project the patterned radiation beam onto a target portion of the substrate, the apparatus further comprising an electromagnetic motor according to claim 17 to position the support or substrate table.

21. A magnetization tool for post-assembly magnetization of a magnet assembly, the magnet assembly comprising an alternating pattern of magnets for a planar or linear electromagnetic motor, and the magnetization tool comprising:
- a main coil assembly comprising a main coil, an end surface of the main coil configured to be positioned substantially parallel to an outer surface of the magnet assembly to magnetize a magnetic pole of the magnet assembly, wherein an outer volume of the magnet assembly is entirely located outside an outer volume of the main coil, the main coil configured to generate a magnetic field; and
- a shielding arrangement positioned adjacent the main coil in a plane substantially parallel to the end surface of the main coil, the shielding arrangement configured to generate a shielding magnetic field,
- wherein a resulting magnetic field of the shielding magnetic field and the magnetic field is substantially only protruding the magnetic pole of the magnet assembly and directly adjacent magnetic poles of the magnet assembly such that the magnetic pole of the magnet assembly and the directly adjacent magnetic poles of the magnetic pole have a substantially opposite polarity, wherein the shielding arrangement comprises a plate shaped electrical conductor having an aperture therein.

22. The magnetization tool according to claim 21, wherein the plate shaped electrical conductor is rectangular shaped.

23. The magnetization tool according to claim 21, wherein the plate shaped electrical conductor extends in a plane substantially parallel to the outer surface of the magnet assembly.

24. The magnetization tool according to claim 21, wherein the plate shaped electrical conductor surrounds the main coil.

25. The magnetization tool according to claim 24, wherein a surface of the plate shaped electrical conductor facing the magnet assembly is substantially co-planar with the end surface of the main coil.

26. The magnetization tool according to claim 24, wherein the plate shaped conductor is adapted to receive the main coil.

27. The magnetization tool according to claim 26, wherein a width of the main coil substantially corresponds to a pole pitch of the magnetic pole and wherein a width of the aperture is smaller than or equal to three times the pole pitch.

28. The magnetization tool according to claim 21, where a width of the main coil substantially corresponds to a pole pitch of the magnetic pole.

* * * * *